United States Patent [19]

Hiratsuka

[11] Patent Number: 5,484,012
[45] Date of Patent: Jan. 16, 1996

[54] ELECTRONIC APPARATUS HAVING COOLING SYSTEM

[75] Inventor: Yoshiaki Hiratsuka, Kawasaki, Japan

[73] Assignee: Fujitsu Limited, Kawasaki, Japan

[21] Appl. No.: 356,580

[22] Filed: Dec. 15, 1994

[30] Foreign Application Priority Data

Mar. 15, 1994 [JP] Japan .................... 6-043500

[51] Int. Cl.⁶ .............................. B60H 1/00; H05K 7/20
[52] U.S. Cl. ........................... 165/40; 165/80.3; 361/695; 417/5; 454/184
[58] Field of Search .................................. 62/259.2, 179; 236/49.3; 165/40, 80.3; 361/691, 695, 696; 417/5; 454/184

[56] References Cited

U.S. PATENT DOCUMENTS

| | | | |
|---|---|---|---|
| 4,659,290 | 4/1987 | Kundert | 417/32 |
| 4,722,669 | 2/1988 | Kundert | 417/32 |
| 4,756,473 | 7/1988 | Takemae et al. | 236/49.3 |
| 5,107,398 | 4/1992 | Bailey | 165/80.3 |
| 5,173,819 | 12/1992 | Takahashi et al. | 165/80.3 |

*Primary Examiner*—William E. Wayner
*Attorney, Agent, or Firm*—Armstrong, Westerman, Hattori, McLeland & Naughton

[57] ABSTRACT

An electronic apparatus having a housing in which at least a heat source is housed, the housing being provided with an intake port and an exhaust port, the electronic apparatus comprising a cooling fan mounted in the exhaust port, an auxiliary cooling fan placed near the heat source, a first control portion for controlling a revolving speed of the cooling fan in accordance with a temperature of intake air, and a second control portion for controlling a revolving speed of the auxiliary cooling fan in a first mode when the revolving speed of the cooling fan is less than a reference speed and in a second mode when the revolving speed of the cooling fan is greater than the reference speed, the revolving speed of the auxiliary cooling fan controlled in the first mode being greater than the revolving speed of the auxiliary cooling fan controlled in the second mode.

13 Claims, 13 Drawing Sheets

ELECTRONIC APPARATUS HAVING COOLING SYSTEM

BACKGROUND OF THE INVENTION (1) Field of the Invention

The present invention generally relates to an electronic apparatus having a cooling system, and more particularly to an electronic apparatus having a cooling system which can sufficiently cool a heat source preventing a rise of a noise level.

A electronic apparatus, such as a personal computer, is generally provided with heat sources, such as resistors and a power supply device. Thus, to prevent electronic circuit devices from being damaged by the heat from the heat sources, a cooling system, having a cooling fan, for cooling the electronic circuit devices and the heat sources is provided in the electronic apparatus. It is preferable that the noise level of the operating cooling fan be as low as possible.

(2) Description of the Related Art

Figure 1:
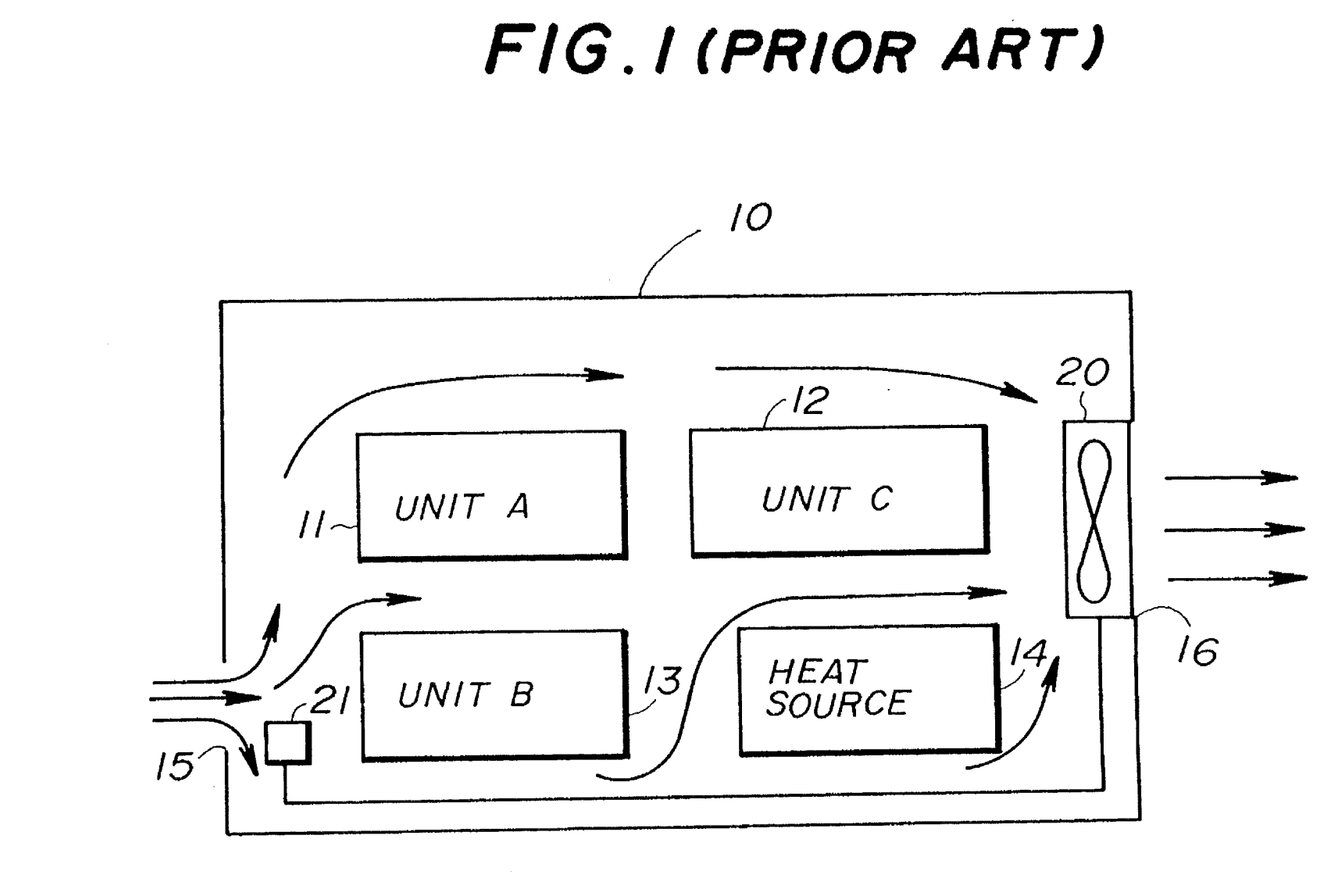
FIG. 1 is a diagram illustrating a conventional electronic apparatus having a cooling system.

In a conventional electronic apparatus, a cooling system is provided as shown in FIG. 1. Referring to FIG. 1, units 11, 12 and 13 and a heat source 14 (e.g. a power supply device) are housed in a housing 10. An intake port 15 and an exhaust port 16 are respectively formed on walls opposite to each other. A cooling fan 20 is mounted in the exhaust port 16 and a temperature sensor 21 is provided near the intake port 15. While the cooling fan 20 is being operated, the air taken into the housing 10 through the intake port 15 flows in spaces among the units 11, 12 and 13 and the heat source 14 as indicated by arrows in FIG. 1. The air is then exhausted through the exhaust port 16. Due to the airflow in the spaces among the units 11, 12 and 13 and the heat source 14, the units 11, 12 and 13 and the heat source 14 are cooled.

The revolving speed of the cooling fan 20 is controlled based on the temperature of the intake air detected by the temperature sensor 21. Examples of a relationship between the controlled revolving speed of the cooling fan 20 and the temperature of the intake air are shown in FIGS. 2A and 2B.

Figure 2A:
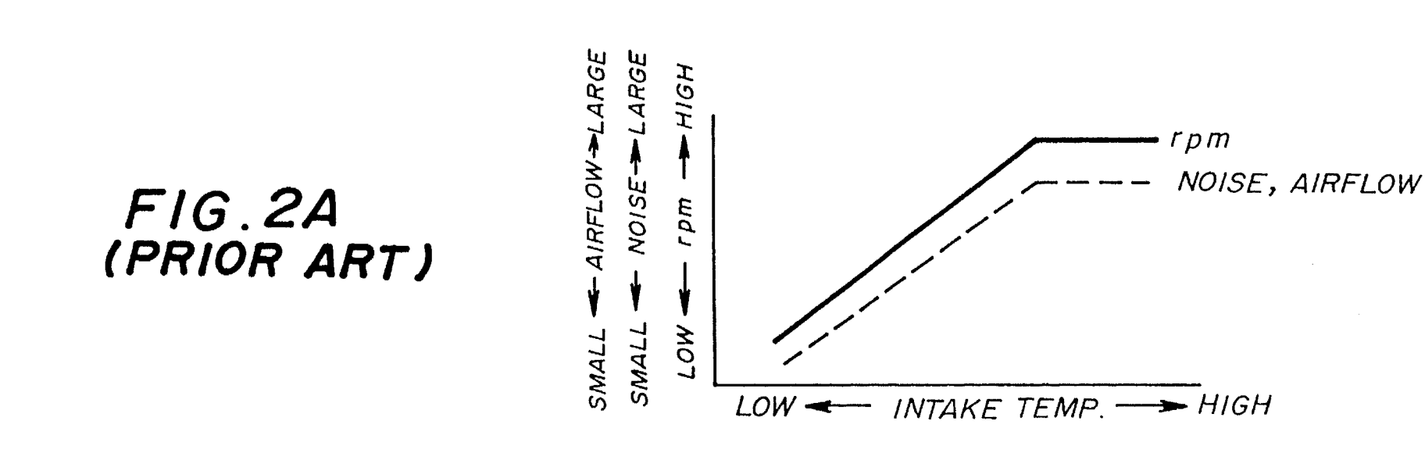
FIGS. 2A and 2B are graphs illustrating relationships between a controlled revolving speed of a cooling fan and the temperature of intake air.

In the case of the relationship shown in FIG. 2A, the revolving speed of the cooling fan 20 is gradually decreased in accordance with a decrease of the temperature of the intake air. That is, the higher temperature of the intake air, the larger the revolving speed of the cooling fan 20 in order to appropriately cool the units 11, 12 and 13 and the heat source 14, and the lower the temperature of the intake air, the smaller the revolving speed of the cooling fan 20 in order to lower the noise of the cooling fan 20.

Figure 2B:
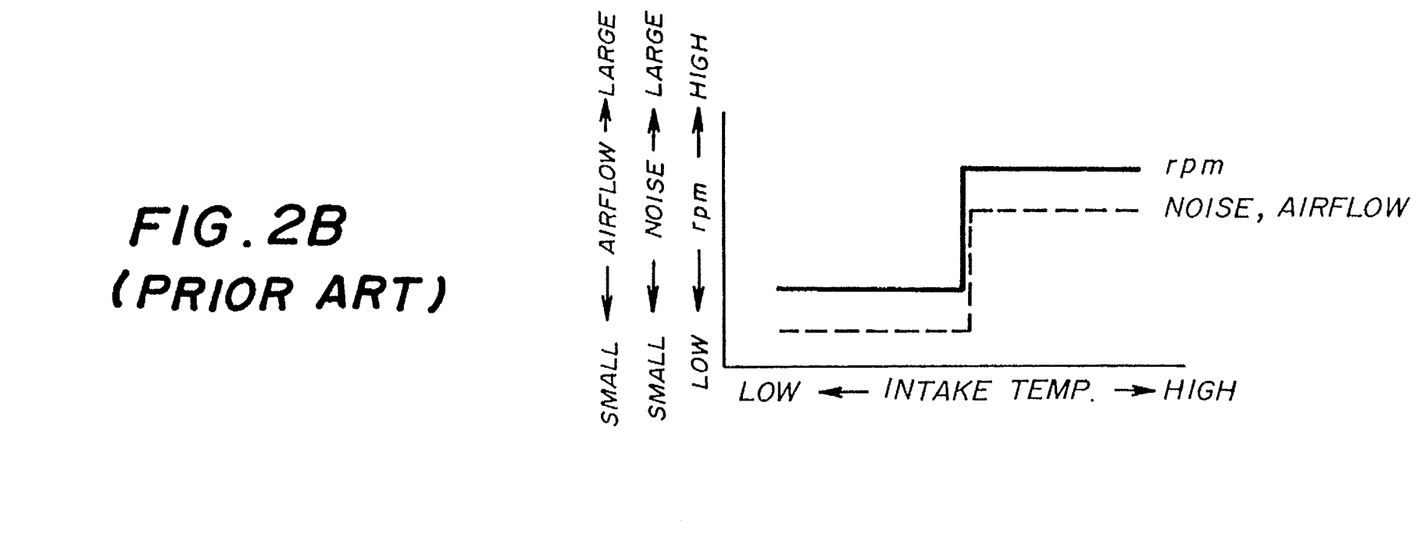

In the case of the relationship shown in FIG. 2B, the cooling fan 20 is driven at a high revolving speed in a range of the temperature of the intake air greater than a predetermined value so that the units 11, 12 and 13 and the heat source 14 are appropriately cooled, and is driven at a low revolving speed in a range of the temperature of the intake air less than the predetermined value so that the noise generated by the cooling fan 20 is lowered.

In a case where the cooling fan 20 is driven at the high revolving speed, the air evenly flows in the spaces among the units 11, 12 and 13 and the heat source 14. However, in a case where the cooling fan 20 is driven at the low revolving speed, the air may be partially stagnated in the spaces among the units 11, 12 and 13 and the heat source 14. When the air is stagnated in the spaces, the cooling effect is rapidly lowered. In tis case, if the air around the heat source 14 is stagnated, the temperatures of the respective units and the heat source 14 itself raise.

To prevent the air from being stagnated in the spaces among the units 11, 12 and 13 and the heat source 14, it can be proposed to increase the low revolving speed of the cooling fan 20. However, an increase of the noise generated by the cooling fan 20 results from the increase of the lower revolving speed of the cooling fan 20.

SUMMARY OF THE INVENTION

Accordingly, a general object of the present invention is to provide a novel and useful electronic apparatus having a cooling system in which the disadvantages of the aforementioned prior art are eliminated.

A specific object of the present invention is to provide an electronic apparatus having a cooling system which can sufficiently cool a heat source provided in the electronic apparatus preventing a rise of the noise level.

The above objects of the present invention are achieved by an electronic apparatus having a housing in which at least a heat source is housed, said housing being provided with an intake port and an exhaust port, the electronic apparatus comprising: a first cooling fan mounted in the exhaust port; a second cooling fan placed near said heat source; a first control means for controlling a revolving speed of said first cooling fan; and a second control means for controlling a revolving speed of said second cooling fan in a first mode when the revolving speed of said first cooling fan is less than a reference speed and in a second mode when the revolving speed of said first cooling fan is greater than the reference speed, the revolving speed of said second cooling fan controlled in the first mode being greater than the revolving speed of said second cooling fan controlled in the second mode.

According to the present invention, when the first cooling fan is driven at a low revolving speed, the second cooling fan is driven at a high revolving speed, and when the first cooling fan is driven at a high revolving speed, the second cooling fan is driven at a low speed or stopped. Thus, even if the airflow generated around the heat source by the first cooling fan is decreased, the heat source can be sufficiently cooled by the second cooling fan. In addition, when the first cooling fan is driven at a high revolving speed, the second cooling fan is driven at a low revolving speed or stopped. Thus, the amount of noise leaking to the outside of the housing is a relatively small amount.

BRIEF DESCRIPTION OF THE DRAWINGS

Other objects, features and advantages of the present invention will become apparent from the following detailed description when read in conjunction with the accompanying drawings, in which.

DESCRIPTION OF THE PREFERRED EMBODIMENTS

A description will be given of an embodiment of the present invention.

Figure 3:
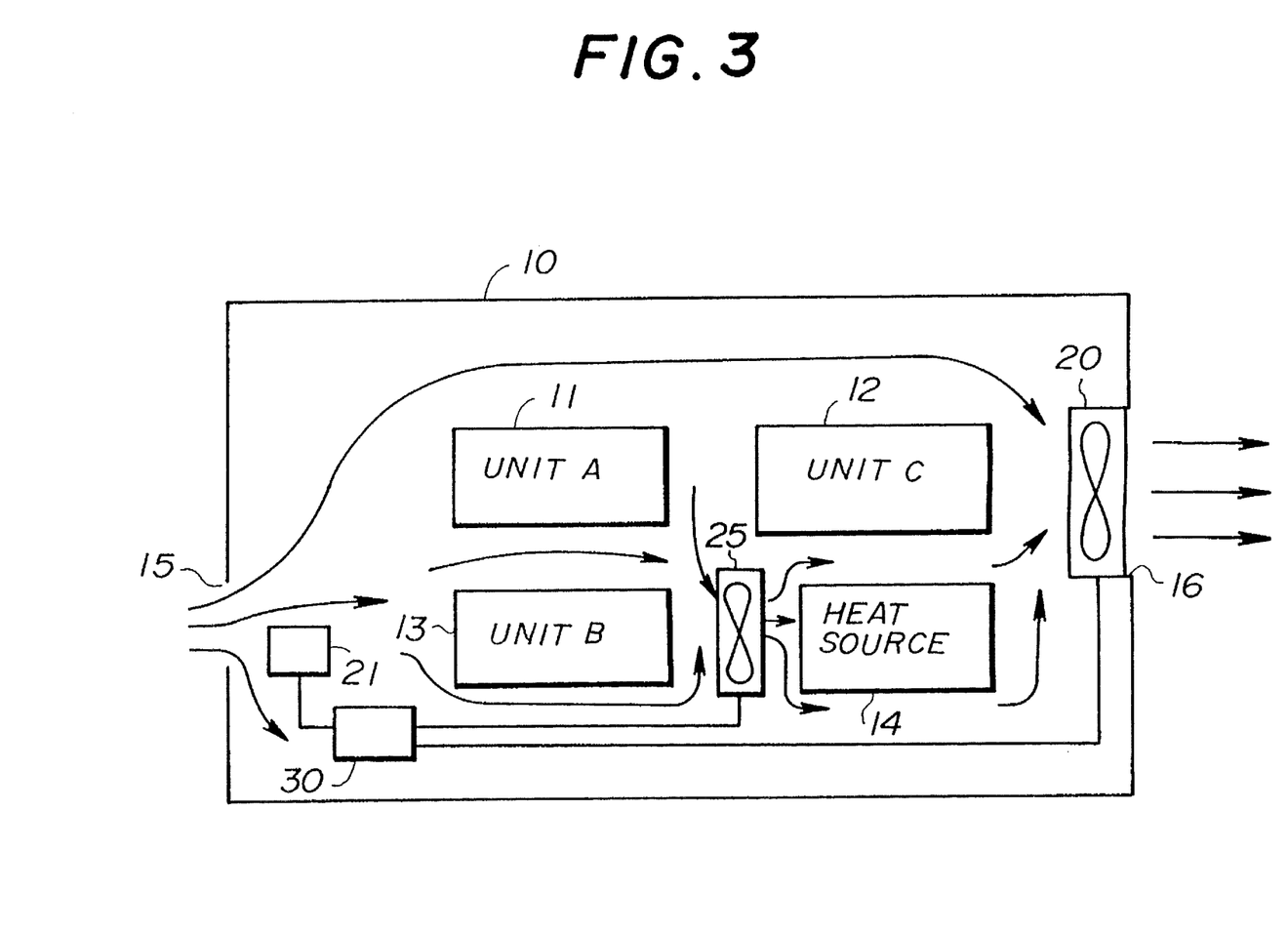
FIG. 3 is a diagram illustrating an electronic apparatus having a cooling system according to an embodiment of the present invention.

An electronic apparatus, such as a personal computer, having a cooling system is formed as shown in FIG. 3. In FIG. 3, those parts which are the same as those shown in FIG. 1 are given the same reference numbers. Referring to FIG. 3, the housing 10 houses a plurality of units 11, 12 and 13 and the heat source 14 (e.g. the power supply device). The intake port 15 and the exhaust port 16 are formed on the housing 10 and the cooling fan 20 is mounted in the exhaust port 16, in the same manner as those shown in FIG. 1. The temperature sensor 21 is provided near the intake port 15 so that the temperature of the intake air taken into the housing 10 through the intake port 15 is detected by the temperature sensor 21. Due to the operation of the cooling fan 20, the air taken into the housing 10 through the intake port 15 flows in the spaces among the units 11, 12 and 13 and the heat source 14 so that the inside of the housing 10 is wholly cooled by the airflow. An auxiliary cooling fan 25 is provided near the heat source 14 so as to singly cool the heat source 14. The cooling fan 20, the auxiliary cooling fan 25 and the temperature sensor 21 are coupled to a control unit 30. The control unit 30 controls operations of the cooling fan 20 and the auxiliary cooling fan 25 based on the temperature detected by the temperature sensor 21.

Figure 4:
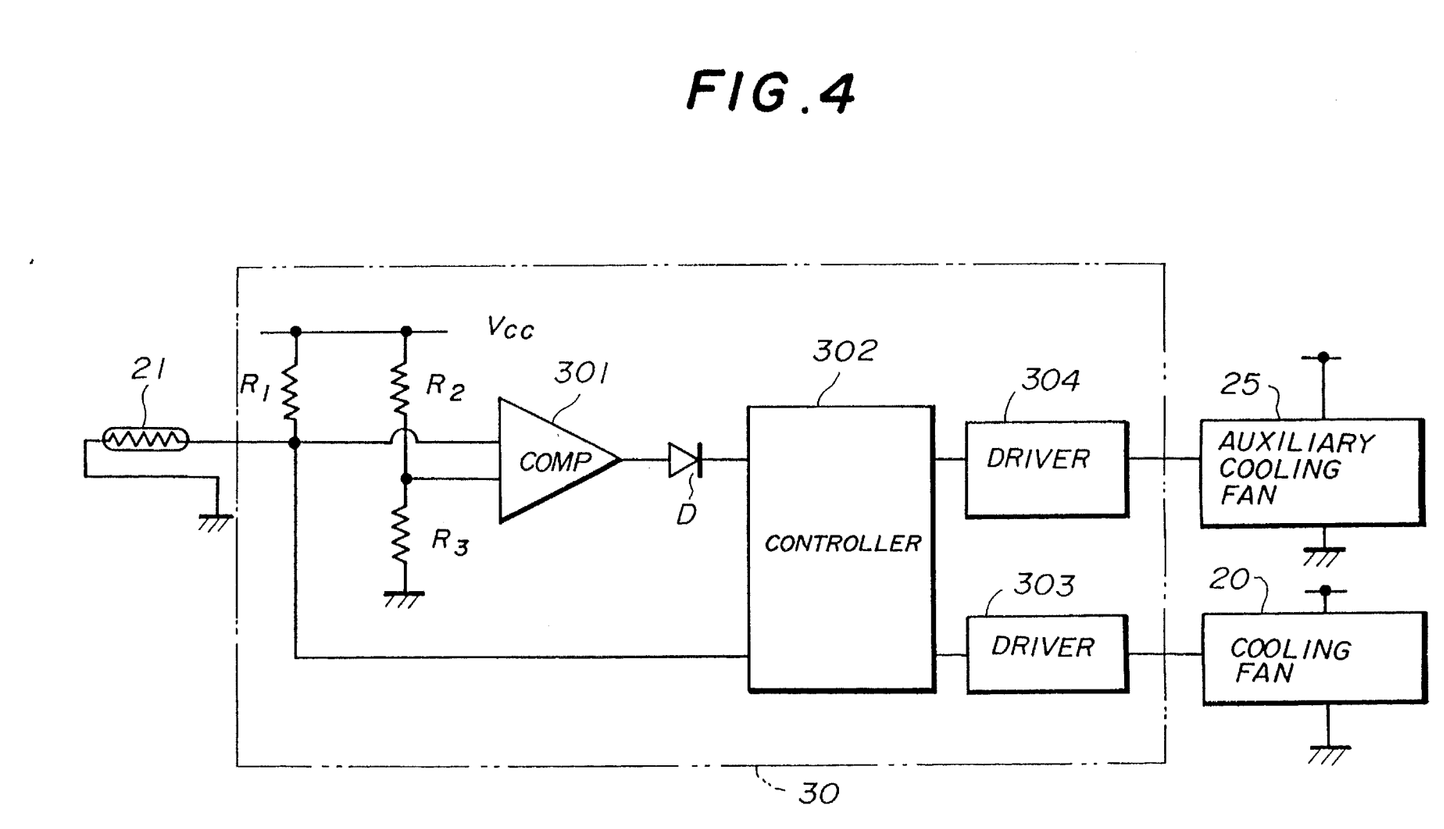
FIG. 4 is a block diagram illustrating a first example of a control unit provided in the electronic apparatus shown in FIG. 3.

The control unit 30 is formed, for example, as shown in FIG. 4. Referring to FIG. 4, a first divisional voltage at a node at which the temperature sensor 21 (e.g. a thermistor) and a resistor R1 serially are connected to each other between the power line (Vcc) and the ground line is supplied, as a detecting voltage of the temperature sensor 21, to a first input port of a comparator 301. A second divisional voltage at a node at which resistors R1 and R2 are connected to each other between the power line (Vcc) and the ground line is suppled, as a reference voltage, to a second input port of the comparator 301. The reference voltage corresponds to a reference temperature $T_{Io}$ which will be described later.

When the detecting voltage of the temperature sensor 21 is equal to or greater than the reference voltage, that is, when the temperature of the intake air is equal to or greater than the reference temperature $T_{Io}$, the comparator 301 outputs a signal having a first level (e.g. a high level). When the detecting voltage of the temperature sensor 21 is less than the reference voltage, that is, when the temperature of the intake air is less than the reference temperature $T_{Io}$, the comparator 301 outputs a signal having a second level (e.g. a low level). The output signal from the comparator 301 is supplied to a controller 302 via a diode D. The controller 302 is formed of a microcomputer system having a CPU, memories (including a ROM and a RAM) and other devices.

The detecting voltage of the temperature sensor 21 is also supplied to the controller 302. The controller 302 generates a first driving control signal based on the detecting voltage of the temperature sensor 21 and a second driving control signal based on the output signal from the comparator 301. The driving control signal is supplied to a first driver 303, the first driver 303 driving the cooling fan 20 in accordance with the first driving control signal. The second driving control signal is supplied to a second driver 304, the second driver 304 driving the auxiliary cooling fan 25 in accordance with the second driving control signal.

Figure 6:
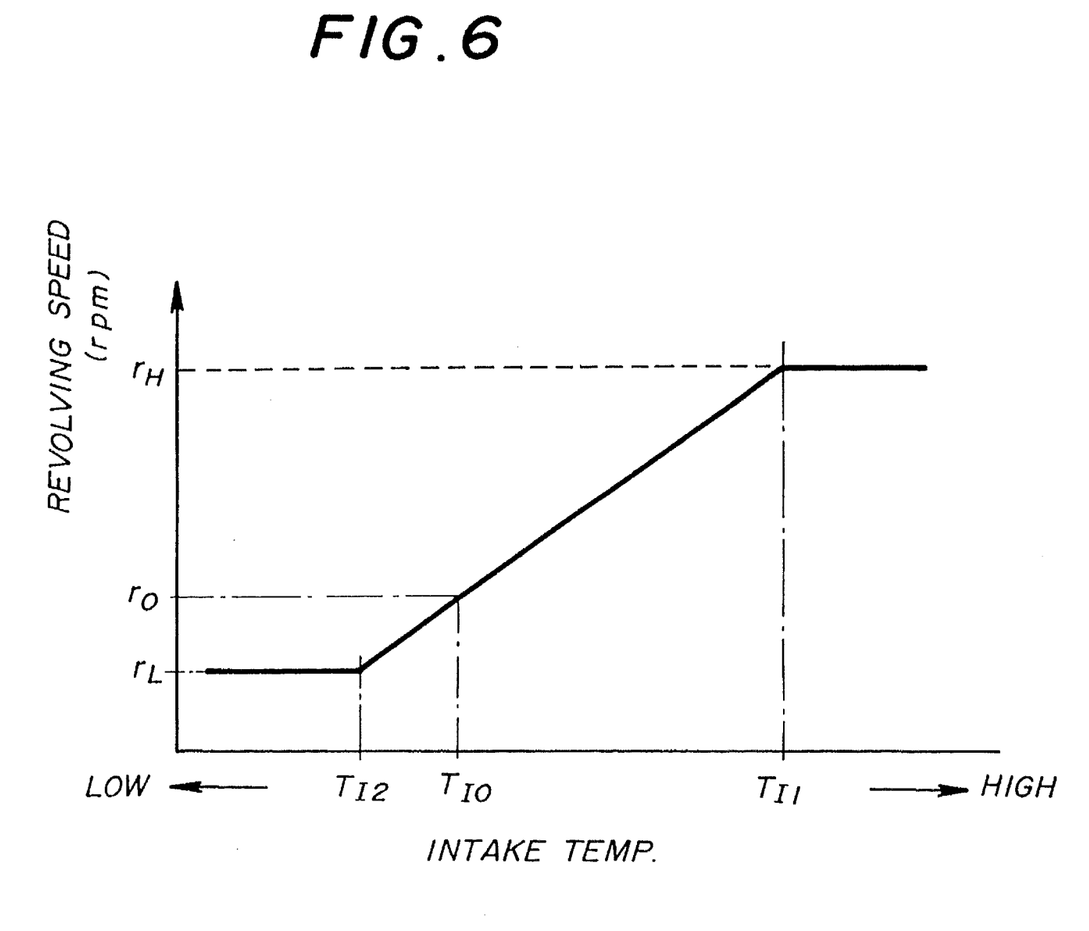
FIG. 6 is a graph illustrating a relationship between a controlled revolving speed of the cooling fan and the temperature of the intake air.

The controller 302 generates the first driving control signal based on the temperature of the intake air so that the revolving speed of the cooling fan 20 is controlled in accordance with a characteristic shown in FIG. 6. This characteristic indicates a relationship between the revolving speed and the temperature of the intake air. In the characteristic shown in FIG. 6, when the temperature of the intake air is higher than a first temperature $T_{I1}$, the cooling fan 20 is driven at a high revolving speed $r_H$. When the temperature of the intake air is lower than a second temperature $T_{I2}$, the cooling fan 20 is driven at a low revolving speed $r_L$. Furthermore, when the temperature of the intake air is in a range between the first temperature $T_{I1}$ and the second temperature $T_{I2}$, the revolving speed of the cooling fan 20 is increased (decreased), between the high revolving speed $r_H$ and the low revolving speed $r_L$, in accordance with an increase (a decrease) of the temperature of the intake air.

Figure 7:
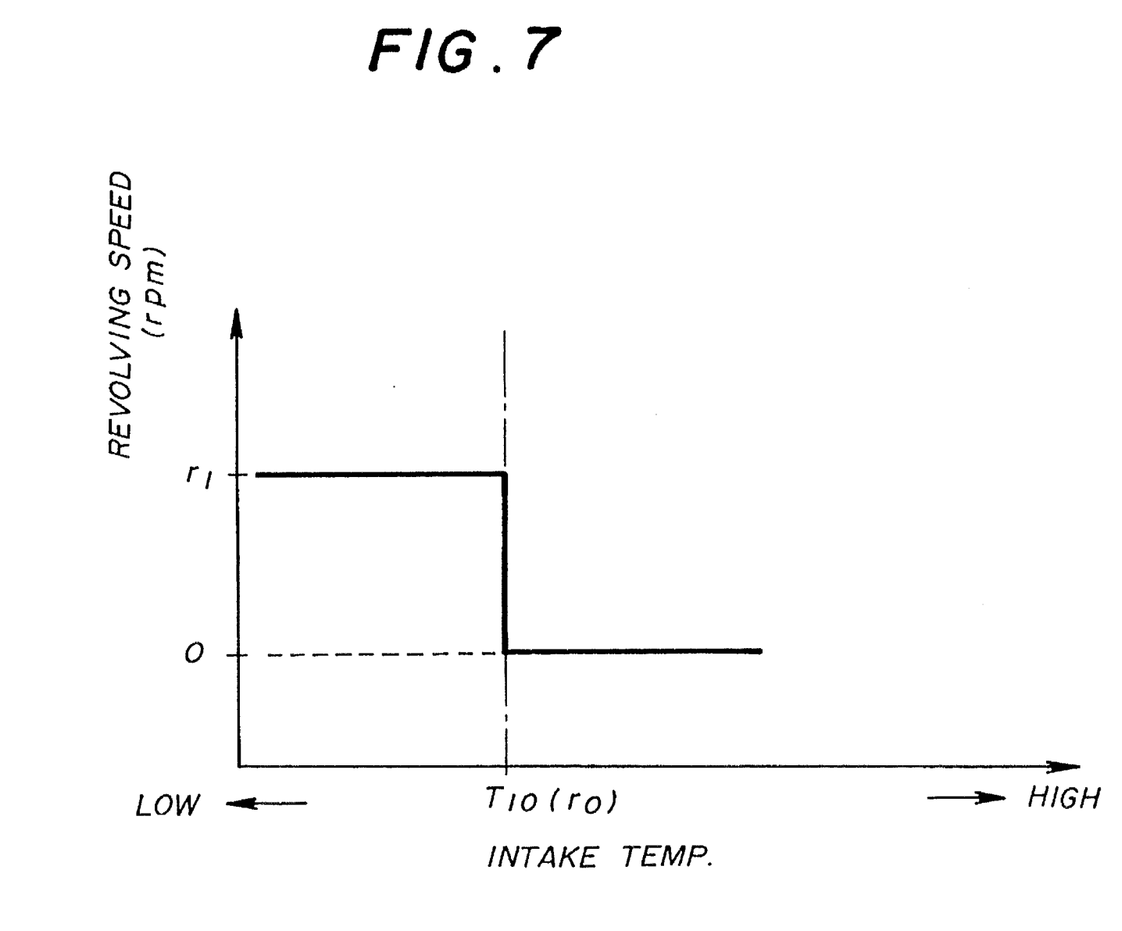
FIG. 7 is a graph illustrating a relationship between a controlled revolving speed of an auxiliary cooling fan and the temperature of the intake air.

The controller 302 generates the second driving control signal based on the output signal of the comparator 301 so that the revolving speed of the auxiliary cooling fan 25 is controlled in accordance with a characteristic shown in FIG. 7. This characteristic shown in FIG. 7 indicates a relationship between the revolving speed and the temperature of the intake air. In the characteristic shown in FIG. 7, when the temperature of the intake air is greater than the reference temperature $T_{Io}$, that is, when the revolving speed of the cooling fan 20 is greater than a reference revolving speed $r_o$ (see FIG. 6), the auxiliary cooling fan 25 is stopped (at a revolving speed "0"). The reference revolving speed $r_o$ is a speed at which the cooling fan 20 is driven at the reference temperature $T_{Io}$ in accordance with the relationship shown in FIG. 6. When the temperature of the intake air is less than the reference temperature $T_{Io}$, that is, when the revolving speed of the cooling fan 20 is less than the reference revolving speed $r_o$, the auxiliary cooling fan is driven at a predetermined revolving speed $r_1$. In other words, the operation of the auxiliary cooling fan 25 depends on the revolving speed of the cooling fan 20.

The characteristic which indicates the optimum relationship between the temperature of the intake air an the revolving speed of the cooling fan 20, as shown in FIG. 6, is experimentally decided. The reference revolving speed $r_o$ is defined as a revolving speed of the cooling fan 20 at which the heat source 14 may not be sufficiently cooled because of the stagnation of the air around the heat source 14. The reference temperature $T_{Io}$ is defined as a temperature of the intake air at which the cooling fan 20 should be driven at the reference revolving speed $r_o$ in accordance with the characteristic shown in FIG. 6.

Figure 5:
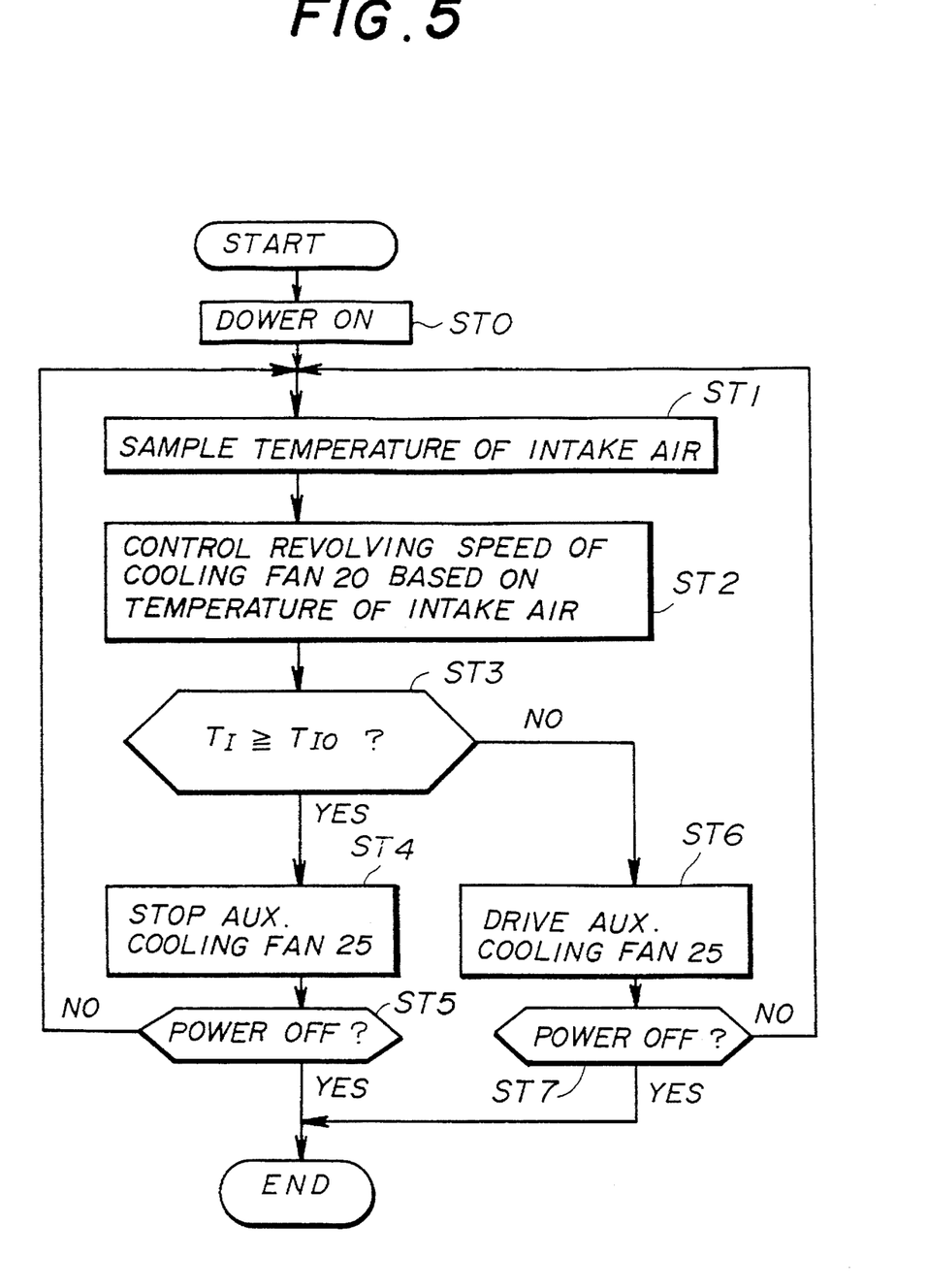
FIG. 5 is a flow chart illustrating an operation of a controller provided in the control unit shown in FIG. 4.

The control unit 30 controls the cooling fan 20 and the auxiliary fan 25 in accordance with a process shown in FIG. 5.

Referring to FIG. 5, after a power supply is turned on in step ST0, the detecting voltage of the temperature sensor 21 is sampled by the controller 302 in step ST1. That is, the temperature of the intake air is detected. The controller 302 outputs the first driving control signal so that the cooling fan 20 is driven at a revolving speed corresponding to the detected temperature in the characteristic shown in FIG. 6, in step ST2. After this, the controller 302 determines, in step ST3, whether the output signal of the comparator 301 has the first level or the second level. When it is determined that the output signal of the comparator 301 has the first level (e.g. the high level), that is, when the detected temperature is greater than the reference temperature $T_{Io}$, the controller 302 outputs the second driving control signal so that the auxiliary cooling fan 25 is stopped in accordance with the characteristic shown in FIG. 7, in step ST4. It is then determined, in step ST5, whether or not the power supply device is turned off. When the power supply device is not turned off, the process in steps ST1 through ST5 is repeated.

In this case, the cooling fan 20 is driven at the rotation speed greater than the reference rotation speed $R_o$ and the auxiliary cooling fan 25 is stopped. Since the cooling fan 20 is driven at the revolving speed greater than the reference revolving speed $r_o$, the air fluently flows in the spaces among the units 11, 12 and 13 and the heat source 14. As a result, the units 11, 12 and 13 and the heat source 14 are sufficiently cooled.

On the other hand, when it is determined, in step ST3, that the output signal of the comparator 302 has the second level (e.g. the low level), that is, when the detected temperature of the intake air is less than the reference temperature $T_{Io}$, the controller 302 outputs the second driving control signal so that the auxiliary cooling fan 25 is driven at the revolving speed $r_1$ in accordance with the characteristic shown in FIG. 7, in step ST6. After this, it is determined, in step ST7, whether or not the power supply device is turned off. When the power supply device is not turned off, the process in steps ST1—ST3, ST6 and ST7 is repeated.

In this case, the cooling fan 20 is driven at the revolving speed less than the reference revolving speed $r_o$ and the auxiliary cooling fan 25 is driven at the revolving speed $r_1$. Thus, although the heat source 14 cannot be sufficiently cooled by the airflow generated by the cooling fan 20, the heat source 14 is cooled by the auxiliary cooling fan 25 driven at the revolving speed $r_1$.

Figure 8:
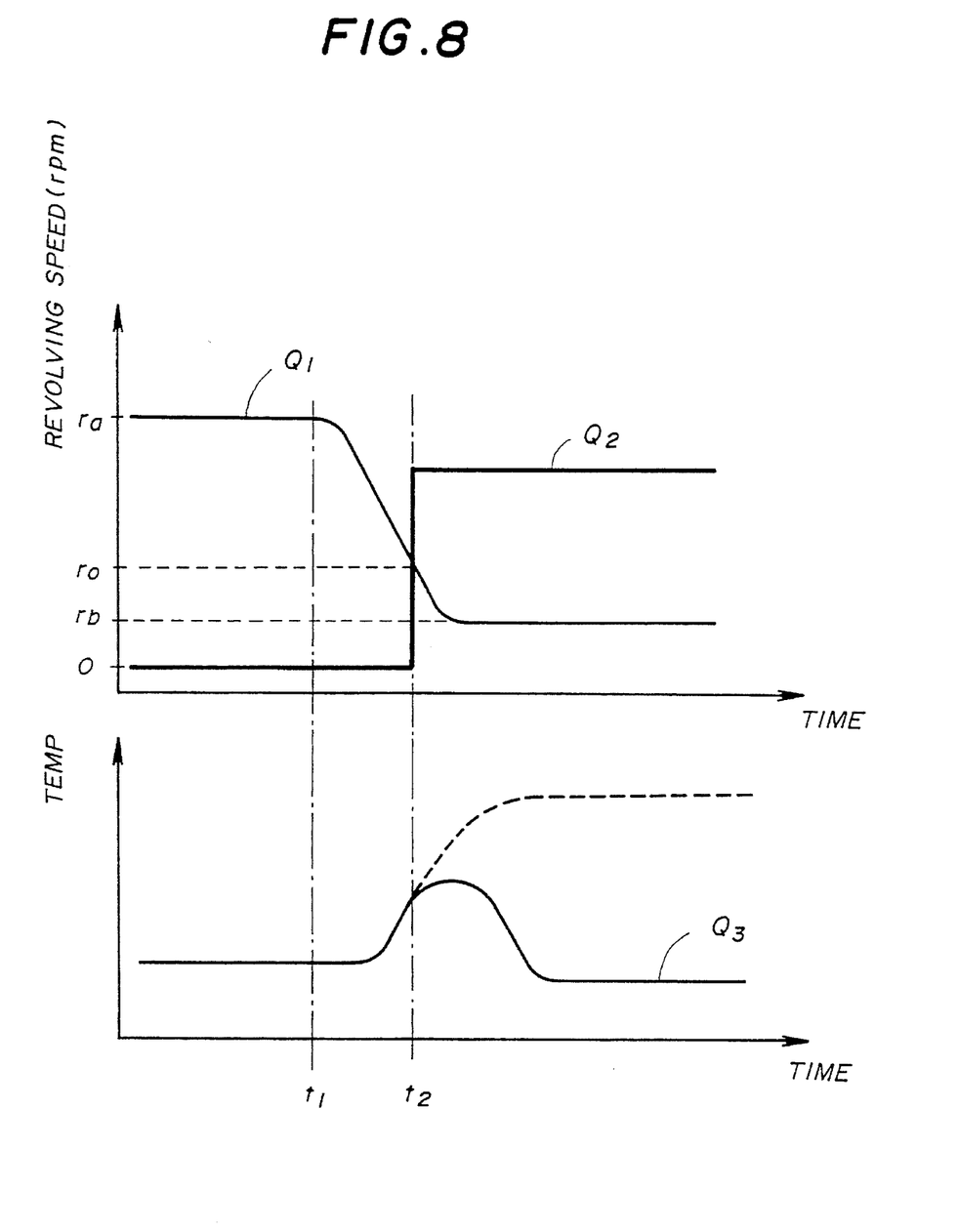
FIG. 8 is a diagram illustrating variation of the revolving speeds of the cooling fan and the auxiliary cooling fan and variation of the surface temperature of a heat source in the electronic apparatus shown in FIG. 3.

According to the operation of the control unit 30, the revolving speeds of the cooling fan 20 and the auxiliary cooling fan 25 and the surface temperature of the heat source 14 are varied, for example, as shown in FIG. 8.

Referring to FIG. 8, the revolving speeds of the cooling fan 20 and the auxiliary cooling fan 25 are respectively controlled in accordance with characteristic curves Q1 and Q2. First, the cooling fan 20 is driven at a revolving speed $r_a$ greater than the reference revolving speed $r_o$. At this time, the auxiliary cooling fan 25 is stopped. The heat source 14 is cooled by the airflow generated by the cooling fan 20, so that the surface temperature of the heat source 14 is maintained at an appropriate value as indicated in a characteristic curve Q3.

The revolving speed of the cooling fan 20 is decreased in accordance with a decrease of the temperature of the intake air (from a time $t_1$). Due to the decrease of the revolving speed of the cooling fan 20, the noise of the cooling fan 20 is lowered.

When the revolving speed of the cooling fan 20 is brought close to the reference revolving speed $r_o$, the surface temperature of the heat source 14 starts to rise. If the revolving speed of the cooling fan 20 is further decreased and this state is maintained, the surface temperature of the heat source 14 further rises as shown by a dotted line in FIG. 8. However, in this state, when the revolving speed of the cooling fan 20 reaches the reference revolving speed $r_o$ (at a time $t_2$), the auxiliary cooling fan 25 starts to be driven at the revolving speed $r_1$ (see Q2). Thus, the heat source 14 is cooled by the auxiliary cooling fan 25. After this, the cooling fan 20 is driven at a revolving speed $r_b$ less than the reference revolving speed $r_o$ and the auxiliary cooling fan 25 is driven at the revolving speed $r_1$, so that the surface temperature of the heat source 14 is maintained at an appropriate value (see Q3).

Figure 9:
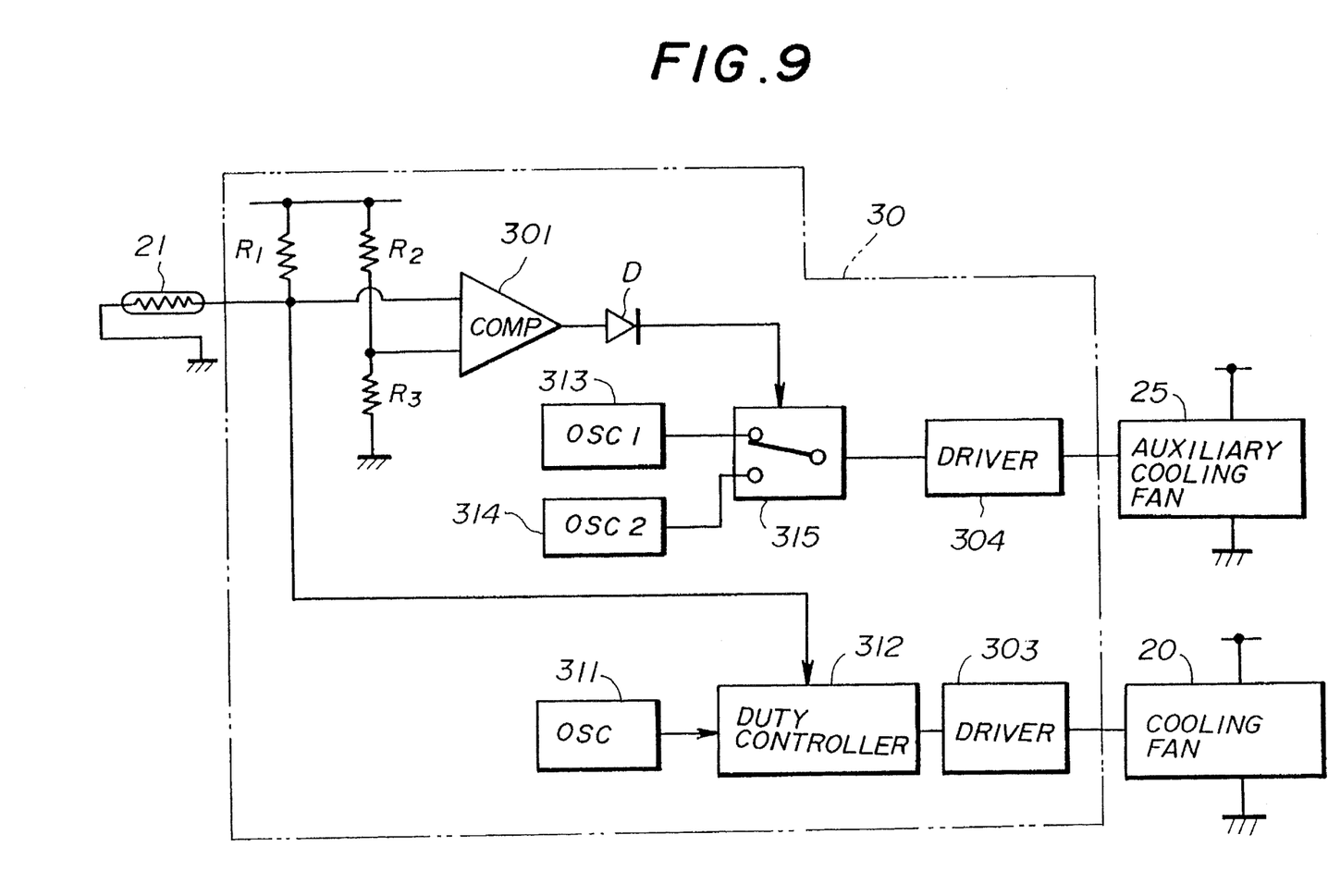
FIG. 9 is a block diagram illustrating a second example of the control unit.

The control unit 30 may also be formed as shown in FIG. 9. In FIG. 9, those parts which are the same as those shown in FIG. 4 are given the same reference numbers.

Referring to FIG. 9, the first divisional voltage is generated, as the detecting voltage corresponding to the temperature of the intake air, at the node at which the temperature sensor 21 and the resistor R1 are connected to each other. The second divisional voltage is generated, as the reference voltage corresponding to the reference temperature $T_{Io}$, at the node at which the resistors R2 and R3 are connected to each other. The comparator 301 outputs an output signal based on the result of the comparison of the detecting voltage to the reference voltage in the same manner as that shown in FIG. 4.

The control unit 30 further has a oscillator 311, a duty controller 312, a first oscillator 313, a second oscillator 314 and a switch 315. The oscillator 311 outputs a pulse signal having a predetermined frequency. The duty controller 312 controls the duty cycle of the pulse signal supplied from the oscillator 311 based on the detecting voltage (corresponding to the detected temperature) from the temperature sensor 21. The pulse signal having a controlled duty cycle is supplied to the first driver 303, the first driver 303 driving the cooling fan 20 at a revolving speed corresponding to the controlled duty cycle. Thus, the duty controller 312 controls the duty cycle of the pulse signal based on the detected temperature so that the revolving speed of the cooling fan 20 is varied as shown in the characteristic shown in FIG. 6.

The first oscillator 313 outputs a first pulse signal having a predetermined frequency and a first duty cycle D1. The second oscillator 314 outputs a second pulse signal having the predetermined frequency and a second duty cycle D2 less than the first duty cycle D1. The switch 315 switches the first oscillator 313 to the second oscillator 314 and vice versa based on the output signal of the comparator 301. When the output signal of the comparator 301 has the first level (e.g. the high level), that is, when the temperature of the intake air is greater than the reference temperature $T_{Io}$, the switch 315 selects the first oscillator 313. As a result, the first pulse having the first duty cycle is supplied from the first oscillator 313 to the second driver 304, the second driver 304 driving the auxiliary cooling fan 25 at a high resolving speed $r_1$. On the other hand, when the output signal of the comparator 301 has the second level (e.g. the low level), that is, when the temperature of the intake air is less than the reference temperature $T_{Io}$, the switch 315 selects the second oscillator 314. As a result, the second pulse having the second duty cycle is supplied from the second oscillator 314 to the second driver 304, the second driver 304 driving the auxiliary cooling fan 25 at a low revolving speed $r_2$ less than the high revolving speed $r_1$.

Figure 10:
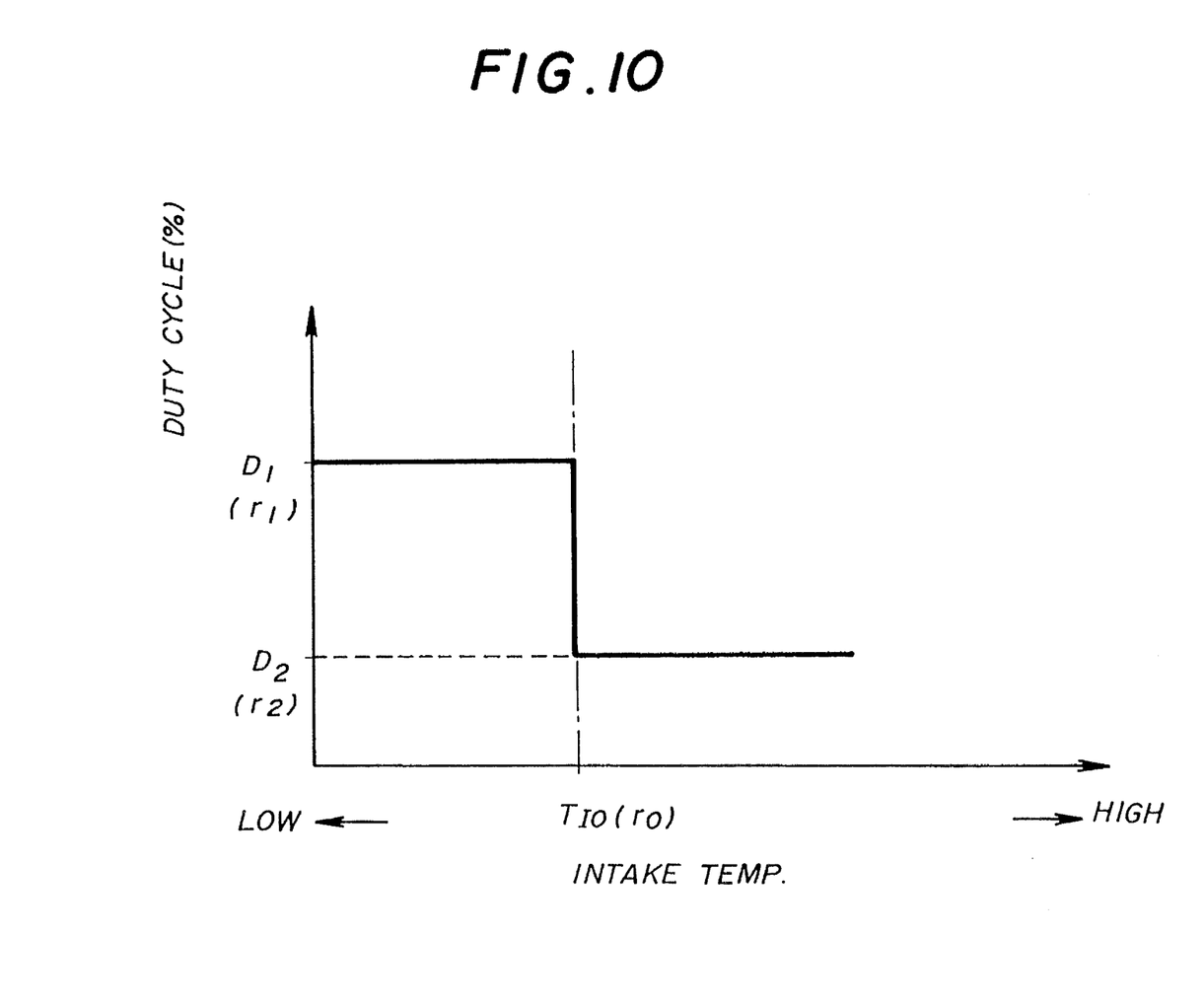
FIG. 10 is a graph illustrating a relationship between a duty cycle of a control signal supplied to the auxiliary cooling fan and the temperature of the intake air.

According to the operation of the control unit 30, the auxiliary cooling fan 25 is controlled in accordance with a characteristic shown in FIG. 10. That is, when the revolving speed of the cooling fan 20 is less than the reference revolving speed $r_o$, the auxiliary cooling fan 25 is driven at the high revolving speed $r_1$. Thus, in this case, even if the airflow generated by the cooling fan 20 around the heat source 14 is lowered, the heat source 14 can be sufficiently cooled by the auxiliary cooling fan 25 driven at the high revolving speed $r_1$.

Figure 11:
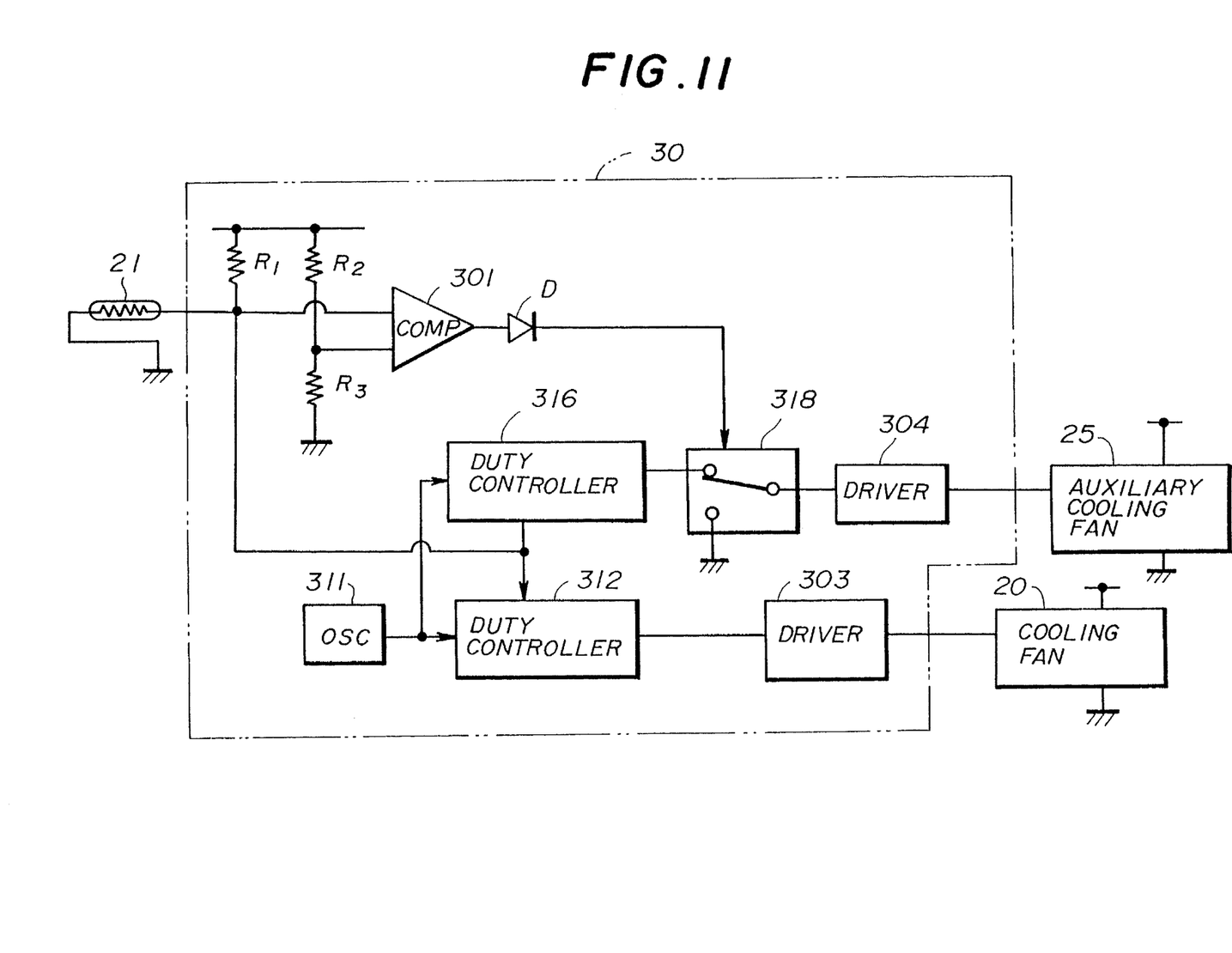
FIG. 11 is a block diagram illustrating a third example of the control unit.

The control unit 30 may be further formed as shown in FIG. 11. In FIG. 11, those parts which are the same as those shown in FIGS. 4 and 9 are given the same reference numbers.

Referring to FIG. 11, the detecting voltage corresponding to the temperature of the intake air is generated by the temperature sensor 21 and resistor R1 in the same manner as that in the cases shown in FIGS. 4 and 9. In addition, the reference voltage corresponding to the reference temperature $T_{Io}$ is generated by the resistors R2 and R3 in the same manner as that in the cases shown in FIG. 4 and 9. The oscillator 311, the duty controller 312 and the first driver 303 operate in the same manner as those shown in FIG. 9, so that the revolving speed of the cooling fan 20 is controlled in accordance with the characteristic shown in FIG. 6.

Figure 12:
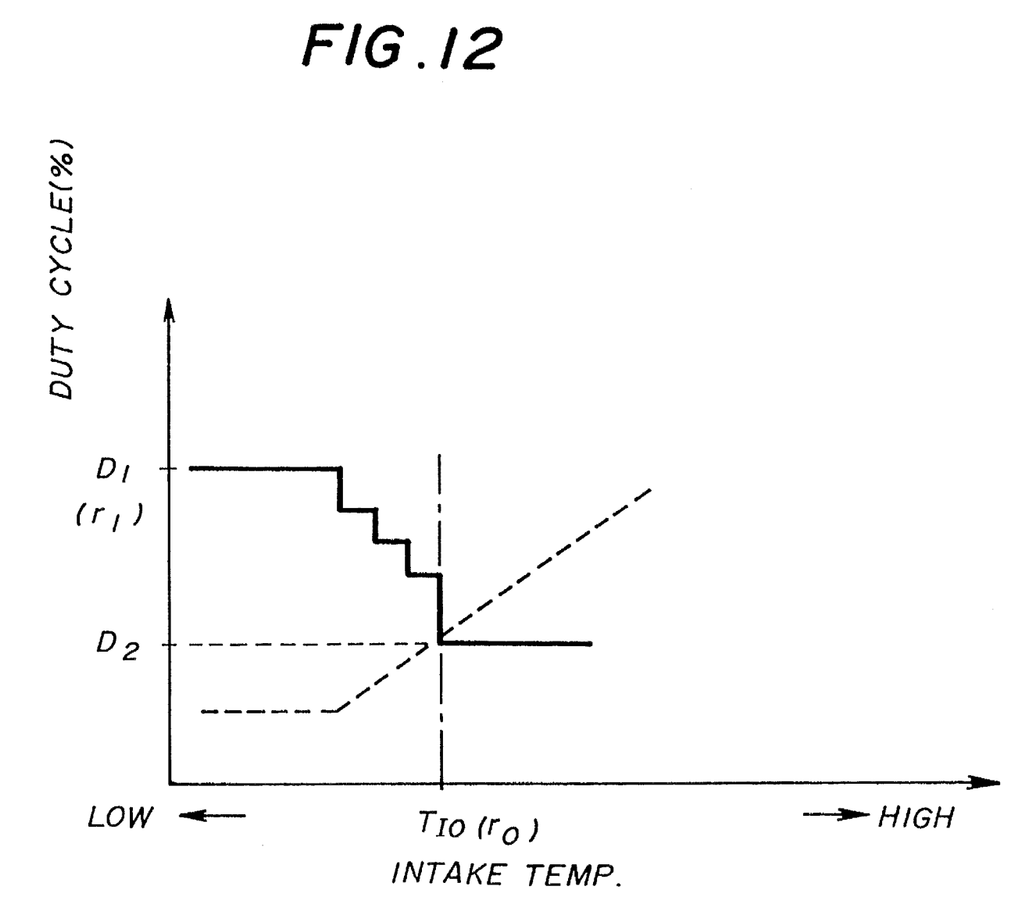
FIG. 12 is a graph illustrating a relationship between a duty cycle of a control signal supplied to the auxiliary cooling fan and the temperature of the intake air.

The control unit 30 further has a duty controller 316 and a switch 318. The duty controller 316 controls the duty cycle of the pulse signal supplied from the oscillator 311 based on the detecting voltage corresponding to the temperature of the intake air, as shown in FIG. 12. In a characteristic shown in FIG. 12, when the temperature of the intake air is less than the reference temperature $T_{Io}$, the duty cycle of the pulse signal is decreased from a first duty cycle $D_1$ to a second duty cycle $D_2$ by several stages in accordance with an increase of the temperature of the intake air. On the other hand, when the temperature of the intake air is greater than the reference temperature $T_{Io}$, the pulse signal is maintained at the second duty cycle $D_2$.

The switch 318 selects the duty controller 316 or the ground line in accordance with the level of the output signal of the comparator 301. When the output signal of the comparator 301 has the first level (e.g. the high level), that is, when the temperature of the intake air is greater than the reference temperature $T_{Io}$, the switch 316 selects the ground line. Thus, the ground level is applied to the second driver 304, so that the auxiliary cooling fan 25 is stopped. On the other hand, when the output signal of the comparator 301 has the second level (e.g. the low level), that is, when the temperature of the intake air is less than the reference temperature $T_{Io}$, the switch 316 selects the duty controller 316. Thus, the pulse signal having the duty cycle which is controlled by the duty controller 316 is supplied to the second driver 304. The second driver 304 then drives the auxiliary cooling fan 25 at a revolving speed corresponding to the controlled duty cycle of the pulse signal.

According to the operation of the control unit 30 shown in FIG. 11, in a case where the revolving speed of the cooling fan 20 is less than the reference revolving speed $r_o$ corresponding to the reference temperature $T_{Io}$, the revolving speed of the auxiliary cooling fan 25 is increased by several stages in accordance with the decrease of the revolving speed of the cooling fan 20. Thus, even if the airflow generated by the cooling fan 20 around the heat source 14 is lowered by the decrease of the revolving speed, the heat source 14 is sufficiently cooled by the auxiliary cooling fan 25.

In the above embodiment including various types of structures of the control unit 30, the auxiliary cooling fan 25 is placed deeper in the interior of the housing 10 than is the cooling fan 20. As a result, the noise level of the auxiliary cooling fan 25 leaked out to the outside of the housing is lower than the noise level of the cooling fan 20. Thus, even if the auxiliary cooling fan 25 is driven at a high revolving speed when the revolving speed of the cooling fan 20 is less than the reference revolving speed $r_o$, the noise leaking out to the outside of the housing 10 is a relatively small.

Figure 13:
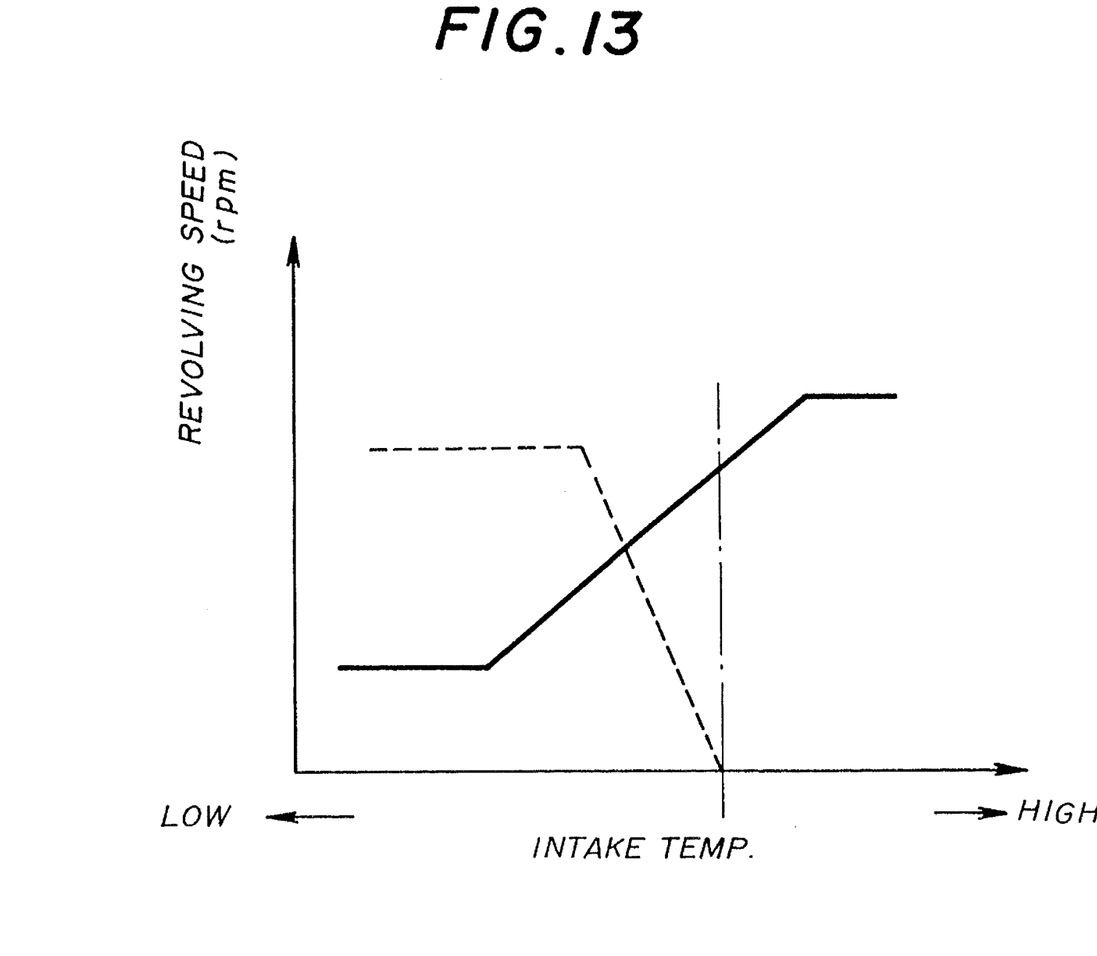
FIG. 13 is a graph illustrating other examples of characteristic curves in accordance with which the cooling fan and auxiliary cooling fan are controlled based on the temperature of the intake air.

The revolving speeds of the cooling fan 20 and the auxiliary cooling fan 25 may be controlled in accordance with the temperature of the intake air as shown in FIG. 13. In FIG. 13, a solid line indicates a characteristic curve in accordance with which the resolving speed of the cooling fan 20 is controlled. A dotted line indicates a characteristic curve in accordance with which the resolving speed of the auxiliary cooling fan 25.

The revolving speed of the cooling fan 20 may be controlled so as to be increased in several stages in accordance with the increase of the temperature of the intake air.

Furthermore, the revolving speed of the cooling fan 20 may be controlled based on a factor other than the temperature of the intake air. In this case, the revolving speed of the auxiliary cooling fan 25 is controlled based on the revolving speed of the cooling fan 20, such as whether or not the revolving speed of the cooling fan exceeds a predetermined revolving speed.

The present invention is not limited to the aforementioned embodiments, and variations and modifications may be made without departing from the scope of the claimed invention.

What is claimed is:

1. An electronic apparatus having a housing in which at least a heat source is housed, said housing being provided with an intake port and an exhaust port, the electronic apparatus comprising:

a first cooling fan mounted in the exhaust port;

a second cooling fan placed near said heat source;

a first control means for controlling a revolving speed of said first cooling fan; and a second control means for controlling a revolving speed of said second cooling fan in a first mode when the revolving speed of said first cooling fan is less than a reference speed and in a second mode when the revolving speed of said first cooling fan is greater than the reference speed, the revolving speed of said second cooling fan controlled in the first mode being greater than the revolving speed of said second cooling fan controlled in the second mode.

2. The electronic apparatus as claimed in claim 1, wherein said second control means has means for controlling the revolving speed of said second cooling fan at a first speed in the first mode and means for controlling the revolving speed of said second cooling fan at a second speed less than the first speed.

3. The electronic apparatus as claimed in claim 2, wherein the first speed and the second speed are constant values.

4. The electronic apparatus as claimed in claim 2, wherein the first speed is a variable value which is increased in accordance with a decrease of the revolving speed of said first cooling fan.

5. The electronic apparatus as claimed in claim 2, wherein the second speed is zero so that the second cooling fan is stopped in the second mode.

6. The electronic apparatus as claimed in claim 1, wherein said second control means has:

first signal generating means for generating a first control signal;

second signal generating means for generating a second control signal;

determination means for determining whether the revolving speed of the first cooling fan is less or greater than the reference speed;

means for driving said second cooling fan at a first revolving speed based on the first control signal from said first signal generating means when said determination means determines that the revolving speed of said first cooling fan is less than the reference speed; and means for driving said second cooling fan at a second revolving speed less than the first revolving speed based on the second control signal from said second signal generating means when said determination means determines that the revolving speed of said first cooling fan is greater than the reference speed.

7. The electronic apparatus as claimed in claim 6, wherein the first speed at which said second cooling fan is driven based on the first control signal and the second speed at which said second cooling fan is driven based on the second control signal are constant values.

8. The electronic apparatus as claimed in claim 7, wherein the second speed is zero so that said second cooling fan is stopped.

9. The electronic apparatus as claimed in claim 6, wherein the first speed at which said second cooling fan is drive based on the first control signal is a variable value increased in accordance with a decrease of the revolving speed of said first cooling fan.

10. The electronic apparatus as claimed in claim 1, wherein said first control means controls the revolving speed of said first cooling fan so that the revolving speed of said first cooling fan is increased in accordance with an increase of a temperature of intake air taken into said housing through the intake port, and wherein said second control means has:

determination means for determining whether the temperature of the intake air is less or greater than a reference temperature corresponding to the reference speed;

means for controlling the revolving speed of said second cooling fan in the first mode when said determination means determines that the temperature of the intake air is less than the reference temperature; and means for controlling the revolving speed of said second cooling fan in the second mode when said determination means determines that the temperature of the intake air is greater than the reference temperature.

11. The electronic apparatus as claimed in claim 10, wherein the revolving speed of said second cooling fan controlled in the first mode and the revolving speed of said second cooling fan controlled in the second mode are constant values.

12. The electronic apparatus as claimed in claim 11, wherein the revolving speed of said second cooling fan controlled in the second mode is zero so that said second cooling fan is stopped.

13. The electronic apparatus as claimed in claim 10, wherein the revolving speed of the second cooling fan controlled in the first mode is a variable value which is increased in accordance with a decrease of the temperature of the intake air.

\* \* \* \* \*